US012715758B2

(12) United States Patent
Akiyama et al.

(10) Patent No.: US 12,715,758 B2
(45) Date of Patent: Aug. 25, 2026

(54) SELECTIVE HYDROPHOBIC LAYER REMOVAL USING UV IRRADIATION WITH NON-ALIGNED MASK

(71) Applicant: InvenSense, Inc., San Jose, CA (US)

(72) Inventors: Jotaro Akiyama, Minami (JP); Yuki Shibano, Tokyo (JP); Kento Kaneko, Showa-machi (JP); Daishi Arimatsu, Yamanashi-ken (JP); Troy Chase, San Jose, CA (US)

(73) Assignee: InvenSense, Inc., San Jose, CA (US)

( * ) Notice: Subject to any disclaimer, the term of this patent is extended or adjusted under 35 U.S.C. 154(b) by 388 days.

(21) Appl. No.: 18/419,301

(22) Filed: Jan. 22, 2024

(65) Prior Publication Data

US 2024/0429324 A1 Dec. 26, 2024

Related U.S. Application Data

(60) Provisional application No. 63/522,258, filed on Jun. 21, 2023.

(51) Int. Cl.
*H01L 21/00* (2006.01)
*H04R 1/08* (2006.01)
*H10F 99/00* (2025.01)

(52) U.S. Cl.
CPC ............... *H10F 99/00* (2025.01); *H04R 1/08* (2013.01); *H04R 2201/003* (2013.01); *H04R 2307/023* (2013.01)

(58) Field of Classification Search
CPC ..... H10F 99/00; H04R 1/08; H04R 2307/023; H10D 30/024; H10D 30/62; H10D 64/015; H10D 64/017; H10D 64/018; H10D 64/021; H10D 64/514; H10D 64/516; H10D 64/518; H10D 64/685; H10D 64/517; H10D 30/031; H10D 30/0314; H10D 30/0316; H10D 30/0321; H10D 30/60; H10D 30/6725; H10D 30/6755; H10D 64/011; H10D 99/00; H10W 90/724; H10W 20/044; H10W 20/063; H10W 20/074; H10W 70/05; H10W 70/66; H10W 72/877; H10W 72/884; H10W 74/15; H10W 90/732; H10W 90/753; H10W 90/754; H10P 52/00; H10P 14/27; H10P 14/3246; H10P 14/432; H10P 14/46; H10N 60/0912; H10N 60/12; H10N 60/30; H10N 60/805; H10N 30/208; H10N 30/302; H10N 30/853
See application file for complete search history.

(56) References Cited

U.S. PATENT DOCUMENTS

2002/0181725 A1* 12/2002 Johannsen ............ B82Y 30/00
381/174

* cited by examiner

*Primary Examiner* — Niki H Nguyen

(57) ABSTRACT

A sensing device is formed on a first side of a wafer device, forming a cavity between sensing device and the wafer device. An opening of the cavity faces away from the sensing device, positioned on a second side of the wafer device (positioned opposite to the first side). A hydrophobic layer is formed on the second side of the wafer device, on the cavity, on an interior and on an exterior of the sensing device. A mask is formed on the hydrophobic layer on the second side. The mask is perforated that maintains at least a portion of the hydrophobic layer covering the second side of the wafer device exposed. Light is applied to the second side of the wafer device that removes the at least the portion of the hydrophobic layer covering the second side of the wafer device that is exposed. The mask is removed.

21 Claims, 5 Drawing Sheets

SELECTIVE HYDROPHOBIC LAYER REMOVAL USING UV IRRADIATION WITH NON-ALIGNED MASK

CROSS-REFERENCE TO RELATED APPLICATIONS

This application is a Non-Provisional Patent Application that claims the benefit and priority to the provisional Patent Application No. 63/522,258, which was filed on Jun. 21, 2023, which is incorporated herein by reference in its entirety.

BACKGROUND

MEMS ("micro-electro-mechanical systems") are a class of devices that are fabricated using semiconductor-like processes and exhibit mechanical characteristics. For example, MEMS devices may include the ability to move or deform. In many cases, but not always, MEMS interact with electrical signals. A MEMS device may refer to a semiconductor device that is implemented as a micro-electro-mechanical system. A MEMS device includes mechanical elements and may optionally include electronics (e.g., electronics for sensing). MEMS devices include but are not limited to, for example, gyroscopes, accelerometers, magnetometers, pressure sensors, microphone, etc.

Many MEMS devices address stiction by using hydrophobic layers. It is often difficult to use hydrophobic layers to address stiction without impacting the backside of the wafer. Unfortunately, hydrophobic layers on the backside of the wafer results in weak die attach assembly. Removing the hydrophobic layer from the backside of the wafer may damage the silicon and impact the sensitivity of the device. One conventional mechanism may use a mask that is patterned and aligned precisely to protect the backside while allowing hydrophobic layer to coat the interior of the MEMS structure. Unfortunately, using a patterned mask and precise alignment is not only expensive but it also requires high precision to align the patterned mask with the backside of the wafer, which is hard to achieve.

SUMMARY

Accordingly, a need has arisen to apply a hydrophobic layer to the MEMS device including the interior of the MEMS structure without a need to use high alignment precision and without causing weak die attach on the backside of the wafer. It is appreciated that a hydrophobic layer is first applied thereby penetrating the interior of the MEMS structure, resulting in reduced stiction. The backside of the wafer is then covered with a perforated mask (patterned mask) without having to align the perforated mask with the backside of the wafer in a precise manner. Perforation of the patterned mask may be created randomly and irrespective of the wafer. Once the patterned mask is applied to the backside of the wafer, light may be applied. The backside of the wafer that is covered by the patterned mask is protected from the light while the hydrophobic layer on the exposed portion of the backside of the wafer not covered by the patterned mask is removed when it is exposed to light being applied. The patterned mask is then removed. As such, the backside of the wafer results in a surface that includes hydrophobic layer in certain portions (that was previously covered by the patterned mask) but also a surface that does not include hydrophobic layer (that was exposed (i.e., not covered by the patterned mask)), thereby strengthening die attach in comparison to the conventional art where the entire surface of the backside wafer is covered with hydrophobic layer. It is appreciated that the hydrophobic layer that coats the interior structure of the MEMS is substantially maintained because the patterned mask blocks some of the light being applied to the backside of the wafer from reaching the interior of the MEMS as well as the interior structure of the MEMS being further away from the surface of the backside of the wafer thereby remaining substantially unimpacted by the light application.

A method includes forming a sensing device on a first side of a wafer device. The sensing device may include a membrane that detects acoustic signals and wherein the membrane comprises SiN or a polysilicon or SiO. The forming of the sensing device on the first side of the wafer device forms at least a cavity between the sensing device and the wafer device and wherein an opening of the cavity faces away from the sensing device and is positioned on a second side of the wafer device. The second side of the wafer device is positioned opposite to the first side. The method further includes forming a hydrophobic layer (e.g., Perfluorodecyltrichlorosilane (FTDS) or Dibromo-dodecenyl-methylsufimide (DDMS), fluoroctatrichlorosilane (FOTS), etc.), through a Self-Assembly Monolayer (SAM) process, on the second side of the wafer device, on the cavity, on an interior and on an exterior of the sensing device. The method also includes forming a mask on the hydrophobic layer on the second side of the wafer device. The mask is perforated and wherein the perforation maintains at least a portion of the hydrophobic layer covering the second side of the wafer device exposed. In some nonlimiting examples, the mask may include polymer or a rigid material including glass. The method also includes applying a light (e.g., ultraviolet light) onto the second side of the wafer device. It is appreciated that the applying removes the at least the portion of the hydrophobic layer covering the second side of the wafer device that is exposed. The method also includes removing the mask, wherein the second side of the wafer device includes a first portion that corresponds to the at least the portion of the hydrophobic layer that was removed and a second portion that is covered by the hydrophobic layer. The second portion corresponds to the hydrophobic layer that covered by the mask.

In some nonlimiting examples, the forming of the mask is performed without aligning the mask with the second side of the wafer device. It is appreciated that the first portion of the wafer device that corresponds to at least the portion of the hydrophobic layer that was removed increases die attach adhesion when attached to a die in comparison to when the first portion and the second portion on the second side of the wafer device are covered with the hydrophobic layer. It is appreciated that the hydrophobic layer within the cavity, on the interior and on the exterior of the sensing device is substantially maintained after applying the light. The light may have a wavelength of smaller than 200 nm.

According to some nonlimiting examples, duration of the light application is between 90-150 seconds and wherein a distance of a light source generating the light to the second side of the wafer device is between 2-6 mm.

These and other features and advantages will be apparent from a reading of the following detailed description.

DESCRIPTION

Before various embodiments are described in greater detail, it should be understood that the embodiments are not limiting, as elements in such embodiments may vary. It should likewise be understood that a particular embodiment described and/or illustrated herein has elements which may be readily separated from the particular embodiment and optionally combined with any of several other embodiments or substituted for elements in any of several other embodiments described herein.

It should also be understood that the terminology used herein is for the purpose of describing certain concepts, and the terminology is not intended to be limiting. Unless defined otherwise, all technical and scientific terms used herein have the same meaning as commonly understood in the art to which the embodiments pertain.

Unless indicated otherwise, ordinal numbers (e.g., first, second, third, etc.) are used to distinguish or identify different elements or steps in a group of elements or steps, and do not supply a serial or numerical limitation on the elements or steps of the embodiments thereof. For example, "first," "second," and "third" elements or steps need not necessarily appear in that order, and the embodiments thereof need not necessarily be limited to three elements or steps. It should also be understood that, unless indicated otherwise, any labels such as "left," "right," "front," "back," "top," "middle," "bottom," "beside," "forward," "reverse," "overlying," "underlying," "up," "down," or other similar terms such as "upper," "lower," "above," "below," "under," "between," "over," "vertical," "horizontal," "proximal," "distal," and the like are used for convenience and are not intended to imply, for example, any particular fixed location, orientation, or direction. Instead, such labels are used to reflect, for example, relative location, orientation, or directions. It should also be understood that the singular forms of "a," "an," and "the" include plural references unless the context clearly dictates otherwise.

Terms such as "over," "overlying," "above," "under," etc. are understood to refer to elements that may be in direct contact or may have other elements in-between. For example, two layers may be in overlying contact, wherein one layer is over another layer and the two layers physically contact. In another example, two layers may be separated by one or more layers, wherein a first layer is over a second layer and one or more intermediate layers are between the first and second layers, such that the first and second layers do not physically contact.

Figure 1:
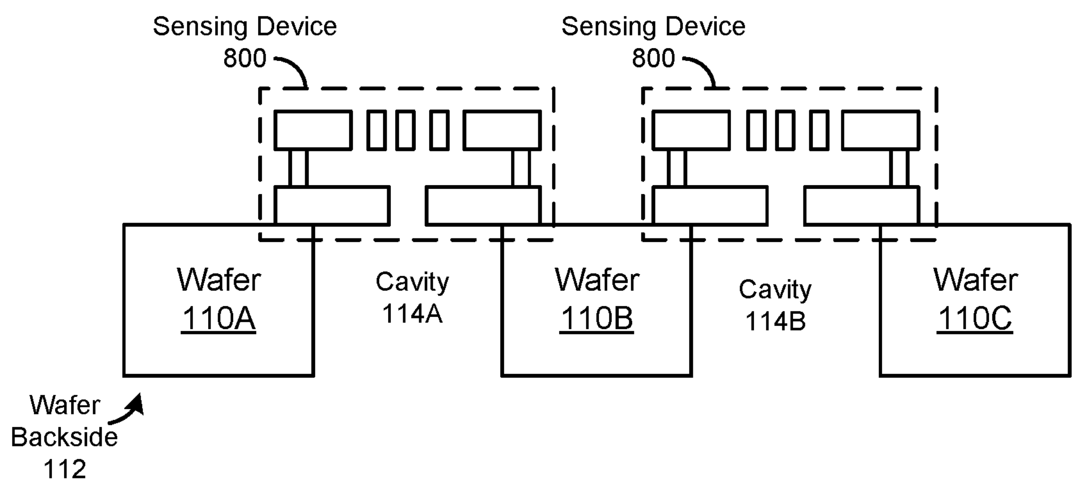
FIG. 1 shows a sensing device according to one aspect of the present embodiments.

FIG. 1 shows a sensing device according to one aspect of the present embodiments. In this nonlimiting example, sensing devices 800 (that may comprise a Micro-Electro-Mechanical Systems (MEMS) structures) are coupled to wafer 110A-C portions to create cavities 114A and 114B as shown. A surface of the wafer 110A-C portions opposite to the surface of the wafers where the sensing devices 800 are coupled is referred to as the wafer backside 112. Traditionally, the wafer backside 112 causes weak die attach after a hydrophobic layer is applied during the assembly process.

In this nonlimiting example, the sensing device 800 is a MEMS microphone for illustration purposes that should not be construed as limiting the scope of the embodiments. For example, the sensing device 800 may be any MEMS device with an opening such as a pressure sensor. The wafer 110A-C portions may comprise silicon.

Figure 2:
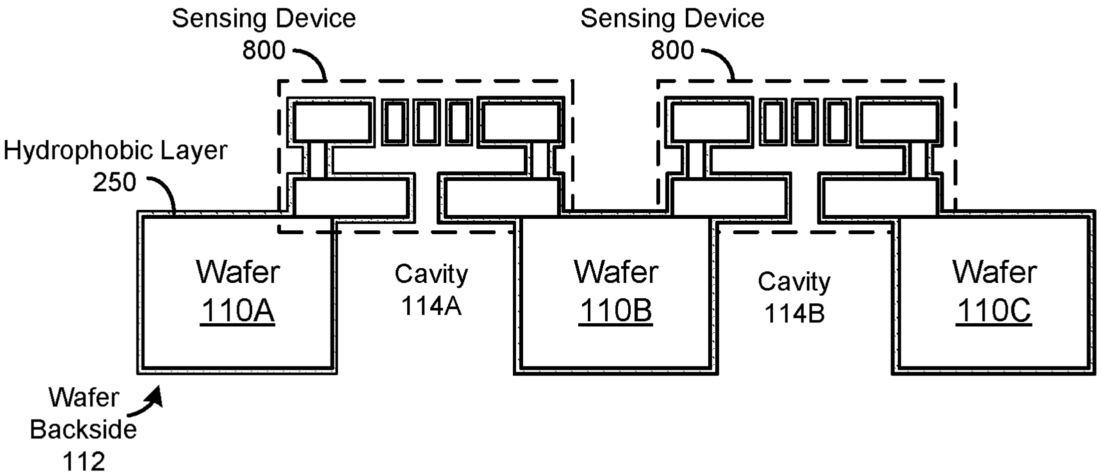
FIG. 2 shows the sensing device after hydrophobic layer is applied according to one aspect of the present embodiments.

FIG. 2 shows the sensing device after hydrophobic layer is applied according to one aspect of the present embodiments. In some nonlimiting examples, a hydrophobic layer 250, e.g., Perfluorodecyltrichlorosilane (FTDS) or Dibromododecenyl-methylsufimide (DDMS), fluoroctatrichlorosilane (FOTS), etc.), through a Self-Assembly Monolayer (SAM) process may be applied to the wafer 110A-110C portions as well as the sensing devices 800 (including the interior and exterior of the MEMS structures). Hydrophobic layer 250 reduces stiction when it is applied to the interior MEMS device. Stiction may refer to when the movable components stick to another structure, e.g., the bumpstop, and fails to release causing performance issues with the device. As illustrated, the hydrophobic layer 250 is applied to not only the sensing devices 800 but also to the wafer backside 112. Hydrophobic layer 250 deposited on the wafer backside 112 may result in weak die attach during assembly process if not addressed.

Figure 3:
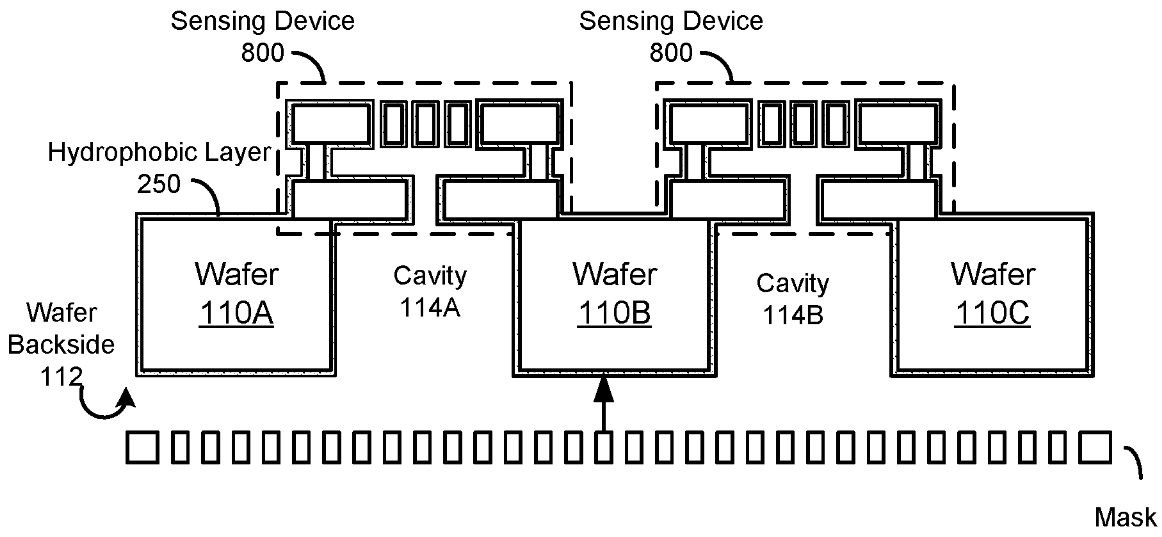
FIG. 3 shows application of a mask to the hydrophobically coated sensing device according to one aspect of the present embodiments.

FIG. 3 shows application of a mask to the hydrophobically coated sensing device according to one aspect of the present embodiments. In this nonlimiting example, a mask 310 (perforated mask) is applied to the wafer backside 112. In some nonlimiting examples, the mask 310 may include polymer or a rigid material including glass. As illustrated the mask 310 covers not only a portion of the wafer backside 112 but also a portion of the cavities 114A and 114B. It is appreciated that the mask 310 does not need to be precisely aligned (as was required conventionally) and that the perforation within the mask 310 may have been created randomly (arbitrarily) and independent of the dimensions of the wafer 110A-110C portions and the cavities 114A and 114B. In one nonlimiting example, the perforation within the mask 310 may be approximately 3.2 um and a pitch of approximately 1.7 mm with a diameter of 1.35 mm and the cavities 114A and 114B may be approximately 190 um.

Figure 4:
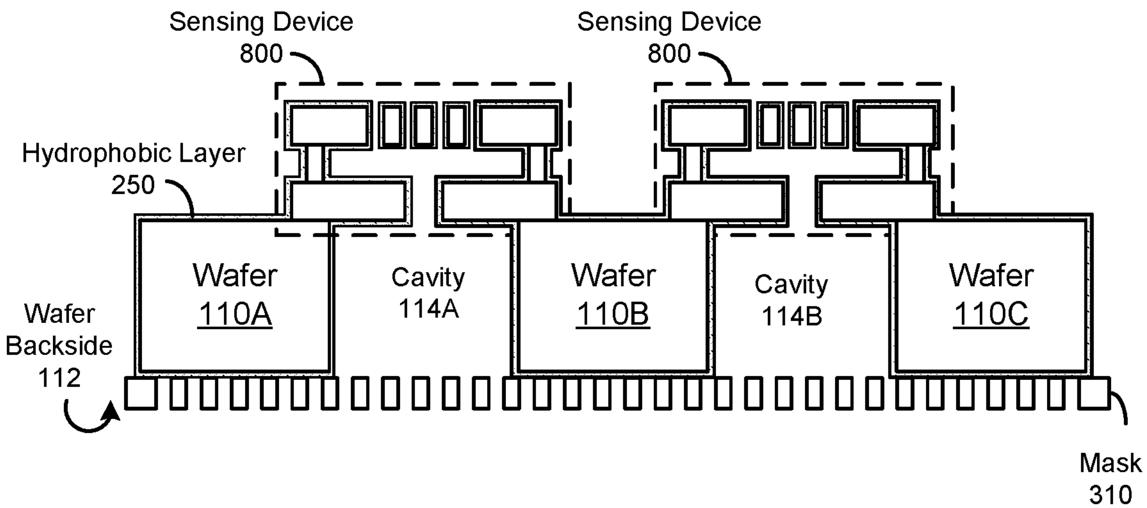
FIG. 4 shows the mask covering the backside of the hydrophobically coated sensing device according to one aspect of the present embodiments.

FIG. 4 shows the mask covering the backside of the hydrophobically coated sensing device according to one aspect of the present embodiments. The mask 310 covers a portion of the hydrophobic layer 250 deposited on the wafer backside 112 while leaving other portions of the hydrophobic layer 250 deposited on the wafer backside 112 exposed. Similarly, the mask 310 covers a portion of the cavities 114A and 114B on the wafer backside 112 while leaving other portions of the cavities 114A and 11B exposed.

Figure 5:
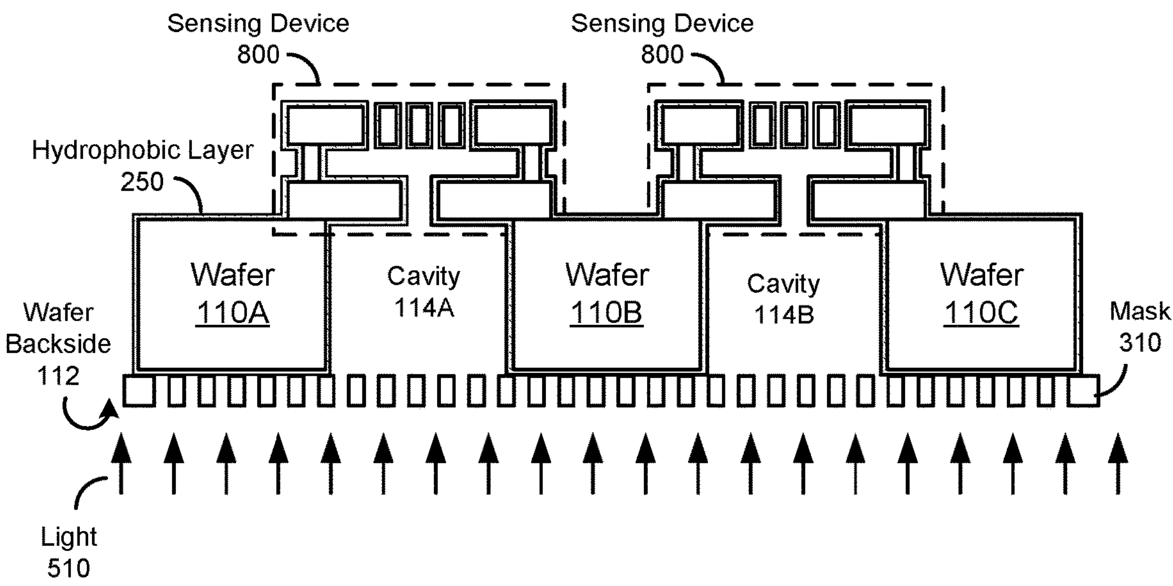
FIG. 5 shows application of light to the backside of the hydrophobically coated sensing device covered with a mask according to one aspect of the present embodiments.

FIG. 5 shows application of light to the backside of the hydrophobically coated sensing device covered with a mask according to one aspect of the present embodiments. In this nonlimiting example, light 510 (e.g., ultraviolet) is applied to the wafer backside 112. The perforation in the mask limits amount of ozone created when the light is applied. In one nonlimiting example, the light 510 may have a wavelength of smaller than 200 nm (e.g., 184 nm, 172 nm, etc.) and it may be applied between 90-150 seconds in one application. In one nonlimiting example, the light 510 may be applied between approximately 5-30 minutes. The light source may be positioned between 2-6 mm away from the wafer device in some nonlimiting example.

Figure 6:
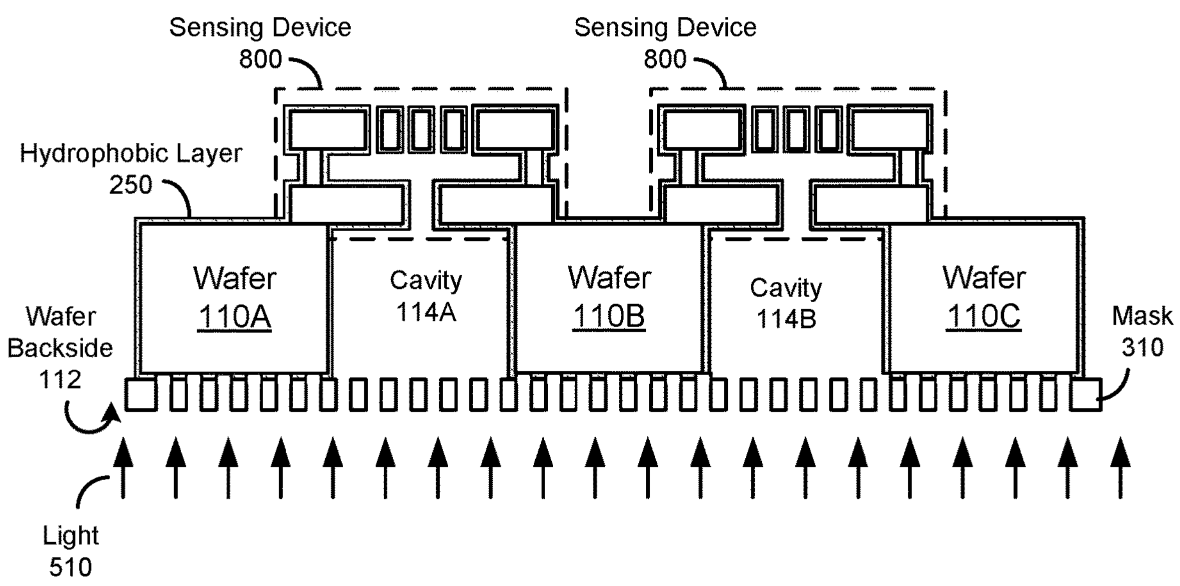
FIG. 6 shows the backside of the hydrophobically coated sensing device with the hydrophobic layer being selectively removed according to one aspect of the present embodiments.

FIG. 6 shows the backside of the hydrophobically coated sensing device with the hydrophobic layer being selectively removed according to one aspect of the present embodiments. Application of light 510 causes the exposed hydrophobic layer 250 on the wafer backside 112 (i.e., hydrophobic layer 250 on the wafer backside 112 that is not covered by the mask 310) to be removed while the hydrophobic layer 250 covered by the mask 310 is not removed. Moreover, it is appreciated that the application of light 510 does not alter the hydrophobic layer 250 covering the interior of the MEMS structure within the sensing device 800 because the mask 310 covers some portions of the cavities 114A and 114B that prevents light from entering the cavities. Moreover, the very little light that may enter the cavities 114A and 114B is far away from the interior of the MEMS structure of the sensing devices 800 that is covered by the hydrophobic layer 250. As such, the hydrophobic layer 250 that covers the interior MEMS structures of the sensing devices 800 remains substantially intact, thereby maintaining the reduced stiction of the MEMS structures.

Figure 7:
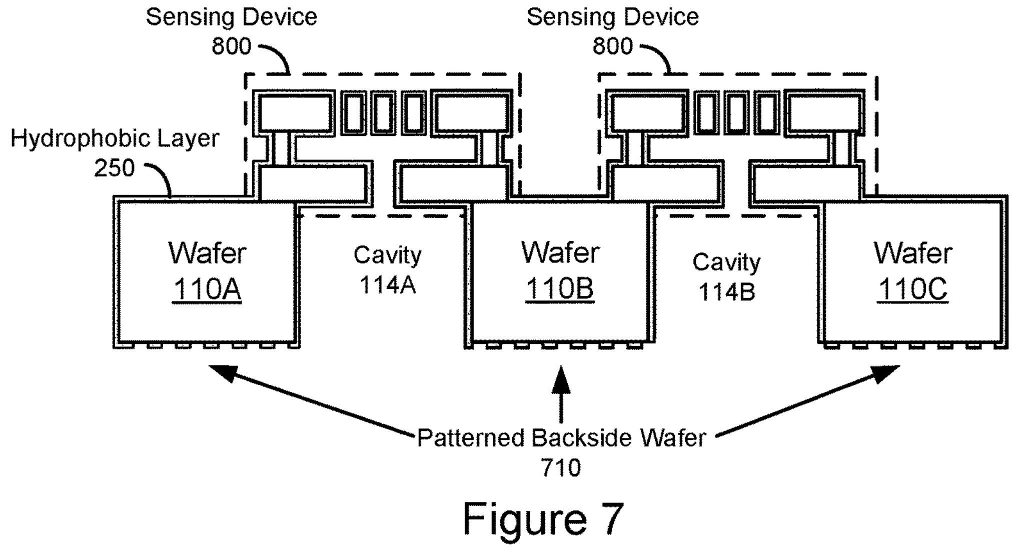
FIG. 7 shows the sensing device with reduced stiction and improved die attach according to one aspect of the present embodiments.

FIG. 7 shows the sensing device with reduced stiction and improved die attach according to one aspect of the present embodiments. The mask 310 may be removed after the application of light 510. As illustrated, the hydrophobic layer 250 on the wafer backside 112 of the wafer 110A-110C portions that was exposed to light 150 is removed while the hydrophobic layer 250 on the wafer backside 112 of the wafer 110A-110C portions that was covered by the mask 310 is maintained resulting in patterned backside wafer 710. Since certain portions of the hydrophobic layer 250 is removed, the die attach is improved by increasing adhesion during the assembly process. Moreover, as described above, stiction is addressed because the interior MEMS structure of the sensing devices 800 remain unaffected. In other words, die attach is improved by increasing adhesion during the assembly process by removing some portions of the hydrophobic layer 250 in comparison to when no portion of the hydrophobic layer 250 is removed from the wafer backside 112.

As illustrated in FIGS. 1-7, the hydrophobic layer 250 is selectively removed from the wafer backside 112 using light, e.g., ultraviolet, without damaging the silicon and further without a need for precise alignment of mask to the wafer. As such, the die attach is improved during the assembly process by increasing adhesion (through removal of certain portions of hydrophobic layer from the wafer backside) while reducing stiction by maintaining the hydrophobic layer 250 coating within the interior of the MEMS structures.

Figure 8:
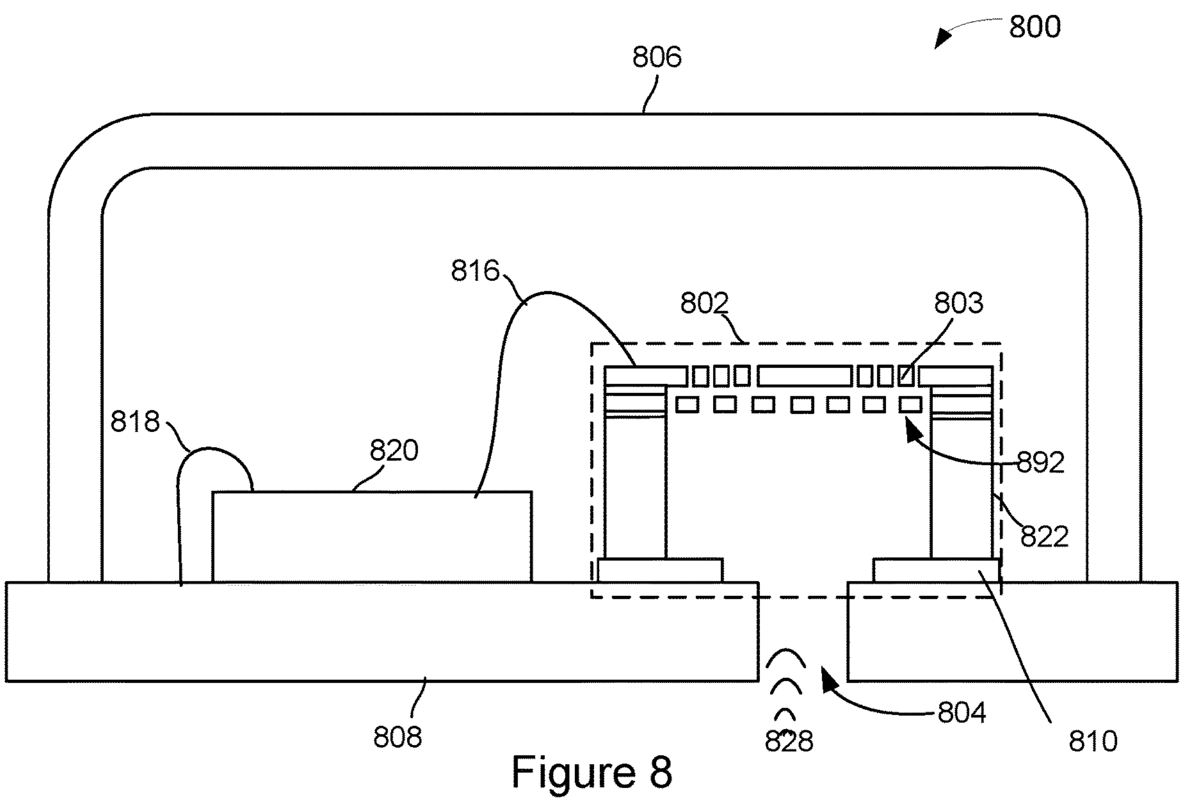
FIG. 8 shows a microphone device according to one aspect of the present embodiments.

FIG. 8 shows a MEMS microphone according to one aspect of the present embodiments. A nonlimiting example of a MEMS microphone integrated package in accordance with one or more embodiments is shown. The MEMS microphone integrated package 800 includes a package substrate 808 (e.g., polymer (e.g., FR4) or ceramic substrate), a sensor substrate 810 (e.g., silicon substrate), a port 804 formed through package substrate 808, a lid (or cover) 806, and an acoustic sensor 802. In an example, acoustic sensor is a capacitive sensor, where a capacitor is formed between diaphragm 803 and back plate 892. The diaphragm 803 may be referred to as the membrane and it may include SiN or a polysilicon or SiO, moves in response to acoustic wave. As shown, MEMS microphone integrated package 800 can also include wire bonds 816, 818 and an ASIC 820. In various embodiments, one or more of acoustic sensor 802, wire bonds 816, 818 and/or the ASIC 820 can be coupled to one another (e.g., electrically or otherwise) to perform one or more functions of MEMS microphone integrated package 800. Handle 822 is formed between sensor substrate 810 and backplate 892.

In some embodiments, although not shown, acoustic sensor 802 as shown, described and/or claimed herein can be considered the combination of the diaphragm 803, the back plate 892 and the ASIC (including any connecting components between the diaphragm, the back plate and/or the ASIC, such as wire bonds 816, 818).

In some embodiments, the back plate 892 and the sensor substrate 810 are part of the same layer. For example, the sensor substrate 810 can initially be one solid substrate from end A to end B and insulation material can then be embedded in sensor substrate 110 to define the ends of back plate 892. In some nonlimiting examples, the back plate 892 may include a perforated region and a solid, non-perforated region. Specifically, the substantially vertical lines in the back plate 892 can represent perforations in the back plate 892 that are provided to allow acoustic sound waves 828 to pass through the back plate 892 to the diaphragm 803. In some embodiments, sensor substrate 810 and back plate 892 are formed from a silicon on insulator (SOI) layer. It is appreciated that the embodiment is described with respect to the acoustic sound waves 828 reaching the back plate 892 first and then to the diaphragm 803 for illustration purposes and should not be construed as limiting the scope of the embodiments. For example, in some embodiments and implementations, the acoustic sound waves 828 may first reach the diaphragm 803 before reaching the back plate 892.

The port 804 can be any size suitable for receiving and/or detecting the acoustic waves 828 intended to enter the MEMS microphone integrated package 800. Specifically the port 804 can provide a recess/opening to an external environment outside of the MEMS microphone integrated package 800 such that sound generated external to the MEMS microphone integrated package 800 is received by the port 804. Accordingly, the port 804 can be positioned at any number of different locations within package substrate 808 in suitable proximity to the back plate 892 and diaphragm 803 that allows the diaphragm 803 to detect the sound waves corresponding to the sound generated external to the MEMS microphone integrated package 800.

As described, acoustic waves 828 enter the MEMS microphone integrated package 800 via the port 804 provided through the package substrate 808, pass through the perforated region of the back plate 892 and are incident on the diaphragm 803. The diaphragm 803 deflects as a result of the sound pressure associated with the acoustic waves 828, and a capacitance results between the diaphragm 803 and the back plate 892 based on the deflection. The ASIC 820 measures the variation in voltage that results when the capacitance changes.

In some embodiments, the ASIC 820 can further process the information at the ASIC for any number of different functions. For example, the variation in capacitance can be amplified to produce an output signal. In various embodiments, the ASIC 820 can include circuitry/components for performing any number of different functions.

Figure 9:
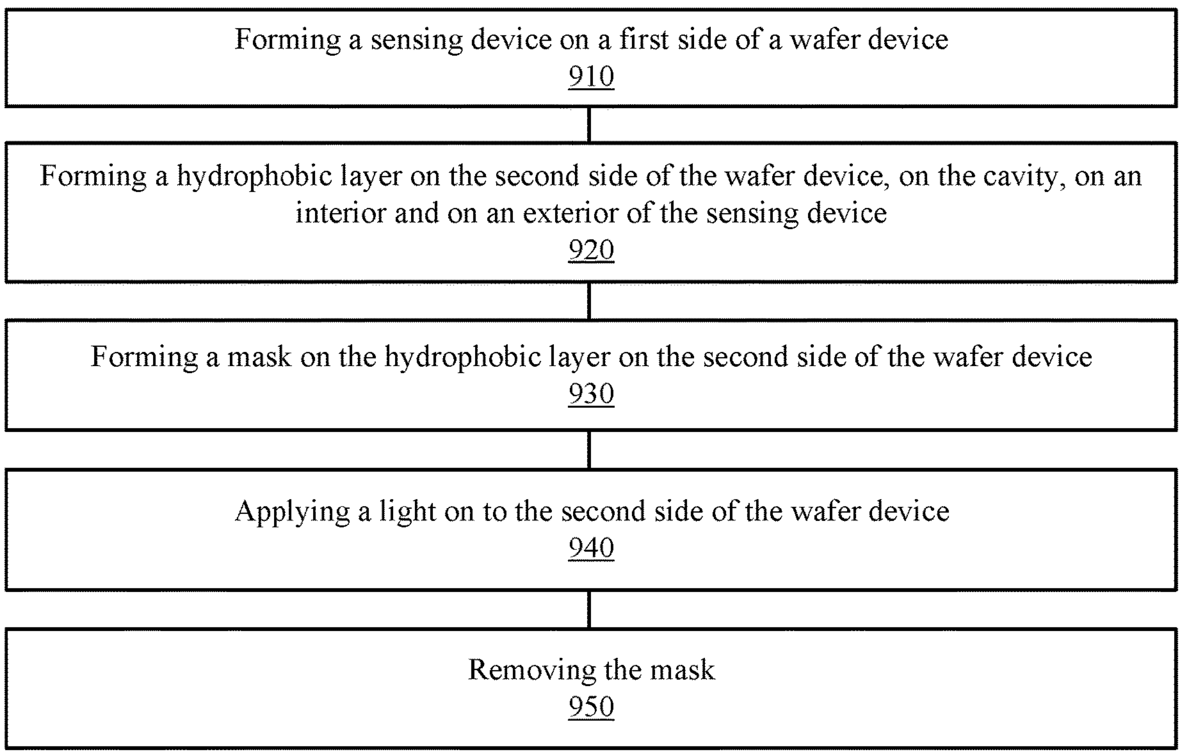
FIG. 9 shows an exemplary flow diagram for selectively removing a portion of the hydrophobic layer from the backside of the hydrophobically coated sensing device according to one aspect of the present embodiments.

FIG. 9 shows an exemplary flow diagram for selectively removing a portion of the hydrophobic layer from the backside of the hydrophobically coated sensing device according to one aspect of the present embodiments. At step 910, a sensing device is formed on a first side of a wafer device, as described in FIGS. 1-8. The sensing device may include a membrane that detects acoustic signals and wherein the membrane comprises SiN or a polysilicon or SiO. Forming of the sensing device on the first side of the wafer device forms at least a cavity between sensing device and the wafer device and wherein an opening of the cavity faces away from the sensing device and is positioned on a second side of the wafer device, as described in FIGS. 1-8. The second side of the wafer device is positioned opposite to the first side. At step 920, a hydrophobic layer (e.g., FTDS or DDMS, SAM, etc.) is formed on the second side of the wafer device, on the cavity, on an interior and on an exterior of the sensing device, as described above in FIGS. 1-8. At step 930, a mask (e.g., a polymer or a rigid material including glass) is formed on the hydrophobic layer on the second side of the wafer device, as described above (without aligning the mask with the second side of the wafer device). As described above, the mask is perforated and wherein the perforation maintains at least a portion of the hydrophobic layer covering the second side of the wafer device exposed. At step 940, a light (e.g., ultraviolet light, smaller than 200 nm, etc.) is applied on to the second side of the wafer device (e.g., duration of light application between 90-150 seconds and a distance of a light source generating the light to the second side of the wafer device is between 2-6 mm). Applying the light removes the at least the portion of the hydrophobic layer covering the second side of the wafer device that is exposed, as described in FIGS. 1-8. At step 950, the mask is removed. The second side of the wafer device includes a first portion that corresponds to the at least the portion of the hydrophobic layer that was removed and a second portion that is covered by the hydrophobic layer. The second portion corresponds to the hydrophobic layer that covered by the mask.

It is appreciated that the first portion of the wafer device that corresponds to the at least the portion of the hydrophobic layer that was removed increases die attach adhesion when attached to a die in comparison to when the first portion and the second portion on the second side of the wafer device are covered with the hydrophobic layer. It is further appreciated that the hydrophobic layer within the cavity, on the interior and on the exterior of the sensing device is substantially maintained after the light is applied.

While the embodiments have been described and/or illustrated by means of particular examples, and while these embodiments and/or examples have been described in considerable detail, it is not the intention of the Applicants to restrict or in any way limit the scope of the embodiments to such detail. Additional adaptations and/or modifications of the embodiments may readily appear, and, in its broader aspects, the embodiments may encompass these adaptations and/or modifications. Accordingly, departures may be made from the foregoing embodiments and/or examples without departing from the scope of the concepts described herein. The implementations described above and other implementations are within the scope of the following claims.

What is claimed is:

1. A method comprising:

forming a sensing device on a first side of a wafer device, wherein the forming of the sensing device on the first side of the wafer device forms at least a cavity between sensing device and the wafer device and wherein an opening of the cavity faces away from the sensing device and is positioned on a second side of the wafer device, wherein the second side of the wafer device is positioned opposite to the first side;

forming a hydrophobic layer on the second side of the wafer device, on the cavity, on an interior and on an exterior of the sensing device;

forming a mask on the hydrophobic layer on the second side of the wafer device, wherein the mask is perforated and wherein the perforation maintains at least a portion of the hydrophobic layer covering the second side of the wafer device exposed;

applying a light on to the second side of the wafer device, wherein the applying removes the at least the portion of the hydrophobic layer covering the second side of the wafer device that is exposed; and removing the mask, wherein the second side of the wafer device includes a first portion that corresponds to the at least the portion of the hydrophobic layer that was removed and a second portion that is covered by the hydrophobic layer, wherein the second portion corresponds to the hydrophobic layer that covered by the mask.

2. The method of claim 1, wherein the forming the mask is performed without aligning the mask with the second side of the wafer device.

3. The method of claim 1, wherein the first portion of the wafer device that corresponds to the at least the portion of the hydrophobic layer that was removed increases die attach adhesion when attached to a die in comparison to when the first portion and the second portion on the second side of the wafer device are covered with the hydrophobic layer.

4. The method of claim 1, wherein the sensing device includes a membrane that detects acoustic signals and wherein the membrane comprises SiN or a polysilicon or SiO.

5. The method of claim 1, wherein the mask includes one of a polymer or a rigid material including glass.

6. The method of claim 1, wherein the hydrophobic layer within the cavity, on the interior and on the exterior of the sensing device is substantially maintained after the applying.

7. The method of claim 1, wherein duration of the application is between 90-150 seconds and wherein a distance of a light source generating the light to the second side of the wafer device is between 2-6 mm.

8. The method of claim 1, where in the hydrophobic layer comprises any one of Perfluorodecyltrichlorosilane (FTDS) or Dibromo-dodecenyl-methylsufimide (DDMS), or fluoroctatrichlorosilane (FOTS).

9. The method of claim 1, where in the hydrophobic layer is applied through a Self-Assembly Monolayer (SAM) layer process.

10. The method of claim 1, wherein the light is an ultraviolet light.

11. The method of claim 1, wherein the light has a wavelength that is smaller than 200 nm.

12. A device comprising:

a semiconductor device; and a wafer device with a first side and a second side, wherein the first side is opposite of the second side, wherein the semiconductor device is formed on the first side of the wafer device that forms at least a cavity between semiconductor device and the wafer device, and wherein an opening of the cavity faces away from the semiconductor device and is positioned on the second side of the wafer device, wherein the second side of the wafer device includes a first portion and a second portion wherein the first portion of the second side is coated with a hydrophobic layer and wherein the hydrophobic layer is absent on the second portion of the second side, wherein the cavity, an interior of the semiconductor device, and an exterior of the semiconductor device are coated with the hydrophobic layer.

13. The device of claim 12, wherein the second portion of the second side of the wafer device increases die attach adhesion when attached to a die in comparison to when the first and the second portions of the second side of the wafer device are covered with the hydrophobic layer.

14. The device of claim 12, wherein the semiconductor device includes a membrane that detects the acoustic signals and wherein the membrane comprises SiN or a polysilicon or SiO.

15. A method comprising:

forming a microphone sensing device comprising a micro-electro-mechanical system (MEMS) device on a first side of a first portion of a wafer device and on the first side of a second portion of the wafer device, wherein the microphone sensing device and the first portion and the second portion of the wafer device forms a cavity with an opening of the cavity facing a second side of the first portion and the second portion of the wafer device that is opposite to that of the first side;

forming a hydrophobic layer on the second side of the wafer device, on the cavity and on an interior of the microphone sensing device;

forming a mask on the hydrophobic layer on the second side of the wafer device, wherein the mask is patterned that creates a plurality of perforation covering a portion of the hydrophobic layer on the second side of the wafer device and leaving another portion of the hydrophobic layer on the second side of the wafer device exposed;

shining a light on to the second side of the wafer device, wherein the shining the light removes the another portion of the hydrophobic layer to expose the wafer device underneath the hydrophobic layer; and removing the mask, wherein the second side of the wafer device includes a first region and a second region, wherein the first region on the second side of the wafer device corresponds to the portion of the hydrophobic layer and is covered with the hydrophobic layer, and wherein the second region on the second side of the wafer device corresponds to the another portion of the hydrophobic layer on the second side that was removed leaving the second region on the second side of the wafer device exposed.

16. The method of claim 15 wherein the light is an ultraviolet light.

17. The method of claim 15, wherein the light has a wavelength that is smaller than 200 nm.

18. The method of claim 15, wherein the forming the mask is performed without aligning the mask with the second side of the wafer device.

19. The method of claim 15, wherein the microphone sensing device includes a membrane that detects acoustic signals and wherein the membrane comprises SiN or a polysilicon or SiO.

20. The method of claim 15, wherein the perforation in the mask limits amount of ozone created when the light is applied.

21. The method of claim 15, wherein the mask includes one of a polymer or a rigid material including glass.

* * * * *